(12) United States Patent
Yang

(10) Patent No.: US 6,528,421 B1
(45) Date of Patent: Mar. 4, 2003

(54) METHOD FOR FORMING SILICIDE

(75) Inventor: Tien-Chu Yang, Hsinchu (TW)

(73) Assignee: Macronix International Co., Ltd. (TW)

(*) Notice: Subject to any disclaimer, the term of this patent is extended or adjusted under 35 U.S.C. 154(b) by 0 days.

(21) Appl. No.: 09/968,006

(22) Filed: Oct. 2, 2001

(51) Int. Cl.[7] ............................................. H01L 21/44
(52) U.S. Cl. ........................ 438/682; 438/649; 438/655
(58) Field of Search ................................. 438/630, 649, 438/655, 664, 682, 592

(56) References Cited

U.S. PATENT DOCUMENTS

| | | | |
|---|---|---|---|
| 5,510,296 A | * | 4/1996 | Yen et al. .................... 438/533 |
| 5,824,586 A | * | 10/1998 | Wollesen et al. .... 148/DIG. 19 |
| 6,221,762 B1 | * | 4/2001 | Byun et al. .................. 438/643 |
| 6,346,466 B1 | * | 2/2002 | Avanzino et al. ........... 361/311 |

* cited by examiner

Primary Examiner—Tuan H. Nguyen

(57) ABSTRACT

A method for forming silicide, at least includes following steps: provide substrate which is covered by semiconductor structure with a rugged topography; form silicon layer on semiconductor structure, where topography of silicon layer is similar to rugged topography; etch silicon layer such that topography of silicon layer is smoothed; form metal layer on silicon layer; and perform thermal process such that suicide layer is made from both metal layer and silicon layer, where suicide layer could be used to form numerous silicide lines. The method could be partially modified as following: provide substrate with rugged first surface; etch substrate such that rugged first surface is changed into smoother second surface; form silicon layer on second surface, where topography of silicon layer is similar to topography of second surface; and form metal layer on silicon layer.

19 Claims, 7 Drawing Sheets

METHOD FOR FORMING SILICIDE

BACKGROUND OF THE INVENTION

1. Field of the Invention

This invention relates generally to a method for forming silicide, and particularly relates to a method for forming silicide lines with low sheet resistance and high thermal stability.

2. Description of the Prior Art

Because silicide has many advantages such as low sheet resistance, low contact resistance to silicon, good adhesion on silicon, and low stress, silicide has been widespreadly used to metal contact, gate line, and other silicide structures.

Fabrication of silicide could be briefly divided into two categories: one category is that directly deposits silicide on substrate and then forms required silicide structures by performing a pattern process; another category is that forms metal layer on silicon substrate, next, performs thermal process to let silicide layer is formed. Moreover, because not each kind of silicide can be formed by deposition, the latter category is more popular than the former category. Especially, distribution of silicide layer can be controlled by predetermining distribution of silicon layer and then pattern process is not necessary, this is so-called self-aligned silicide fabrication.

Salicide is thermally formed by reaction of metal and silicon, agglomeration phenomenon almost is inevitable, especially when temperature is higher or thermal period is longer in the sequent process steps. And occurrence of agglomeration usually induces some problems, such as junction leakage, necking of silicide line, open of silicide line, and resistance increase of silicide. Refers to two indication figures: FIG. 1A which shows agglomeration phenomenon is not occurred and FIG. 1B which shows agglomeration phenomenon is occurred, where semiconductor structure 11 locates on substrate 10 and silicide 12 locates on semiconductor structure 11. Researches discover that agglomeration is related to both structure recombination and phase transformation of silicide layer, and then sheet resistance of thicker and wider silicide structure is hardly degraded by agglomeration phenomenon than that of thinner and narrower silicide structure. In other words, thermal stability of silicide structure is proportional to thickness and width of silicide structure.

Therefore, because scale of silicide structure must be getting decreased whenever critical scale of semiconductor structure is continually decreased, it is indisputable that agglomeration phenomenon is an inevitable problem of silicide structure, especially silicide line which both width and thickness are severely limited.

Besides, owing to structure of semiconductor device is continually complex, silicide lines usually are not formed on a smooth surface but are formed on a rugged semiconductor structure with steps and corners. Under the present circumstances, stress of silicide on corners of semiconductor structure is larger than stress of silicide on flat of semiconductor structure, and then silicide film do not tend to agglomerate on corners during subsequent thermal processes, such that decreased cross-sectional area of silicide line and broken silicide line are unavoidable. Besides, the physical vapor deposited metal film is hard to be conformally formed on the sidewalls of silicon steps, which makes the metal layer thinner at sidewalls. Consequently, the formed silicide is thinner at structure sidewalls. Refers to FIG. 1C and FIG. 1D, where silicon layer 13 is essentially conformal but metal layer 14 is not conformally formed on sidewall of hole 15, and then formed thickness of silicide 12 on sidewall is less than that of silicide 12 on flat part of structure.

Accordingly, thermal stability of silicide line is degraded by decreasing the line width, the aggressive topography underneath the silicide line and the thickness uniformity of silicide lines. It is desired to develop a method for improve above disadvantages, such that silicide structure, especially silicide line, could be further used by very large scale integration (VLSI) and ultra large scale integration (ULSI).

SUMMARY OF THE INVENTION

One main object of the invention is to reduce or even eliminate the effect of agglomeration phenomenon on silicide.

Another object of the invention is to present a method for forming silicide lines, where silicide lines are formed on a rugged surface.

Still an essential object of the invention is to present a method for enhancing thermal stability of silicide without obviously modifying well-known fabrication procedure of silicide.

Further, another main object of the invention is to present a suitable method for forming silicide line with small critical dimension.

One preferred embodiment of this invention is a method for forming silicide. Provide a substrate which is covered by a semiconductor structure with a rugged topography, and form a silicon layer on the semiconductor structure, where the topography of the silicon layer is similar to the rugged topography. Etch the silicon layer such that the topography of the silicon layer is curved, and form a metal layer on the silicon layer. Finally, perform a thermal process such that a silicide layer is made from both the metal layer and the silicon layer, where the suicide layer could be used to form numerous silicide lines.

Another preferred embodiment of this invention also is a method for forming silicide. Provide a substrate with a rugged first surface and etch the substrate such that the rugged first surface is changed into a curved second surface. Form a silicon layer on the second surface, where the topography of the silicon layer is similar to the topography of the second surface. Form a metal layer on the silicon layer; and perform a thermal process such that a silicide layer is made from both the metal layer and the silicon layer, where the silicide layer could be used to form numerous silicide lines.

BRIEF DESCRIPTION OF THE DRAWINGS

A more complete appreciation and many of the attendant advantages will be readily obtained as the same becomes better understood by reference to the following detailed description when considered in connection with the accompanying drawings.

DESCRIPTION OF THE PREFERRED EMBODIMENT

Some preferred embodiments are discussed in detail below, and are used to clearly explain this invention. However, it should be emphasized that this claimed invention could be applied to other applications and is not limited by these embodiments. Therefore, available scope of this invention is not limited by present embodiments but the claims.

Focus on unavoidable defects of silicide line on a rugged surface: stress on corners is larger than stress on flats which induces silicide grains tending to be agglomerated on corners, and thickness of metal and silicon on sidewalls is less than thickness of metal and silicon on flats which also induces silicide grains susceptible to agglomerate. The applicant of this invention presents an idea: because both non-uniform stress and non-uniform thickness are induced by rugged surface, non-uniformity of both stress and thickness could be properly reduced or even eliminated by reducing ruggedness of rugged surface, even by planarizing this rugged surface. Moreover, because silicon layer, especially polysilicon layer, usually is more conformal than metal layer, in order to avoid from damage of semiconductor structure in the rugged surface, it is allowable to replace modification on rugged surface by modification on surface of silicon layer, such that ruggedness of silicon layer is reduced before metal layer is deposited on silicon layer.

In short, the essential concept of this present invention is protecting silicide from agglomeration, especially the agglomeration of silicide line which are induced by underlying rugged surface through reducing ruggedness of this rugged surface before silicide are formed. In contrast, most of well-known prior arts reduce the agglomeration of silicide induced by non-uniform stress and/or non-uniform thickness by complex and expensive methods such as reduce temperature of silicide fabrication, change material of silicide and modify silicide fabrication.

Significantly, because this invention could reduce effect of both non-uniform stress and non-uniform thickness during formation of silicide, such that silicide grains could conformally distributed over all underlying surface. Thus, this. invention could effectively enhance thermal stability, reduce sheet resistance, and avoid form agglomeration. Moreover, because this invention could let metal layer is conformally formed on high-aspect-ratio hole by changing topography of substrate, this invention could let silicide be properly used to form narrow and thin conductive line, such as word line of VLSI device.

Figure 1A:
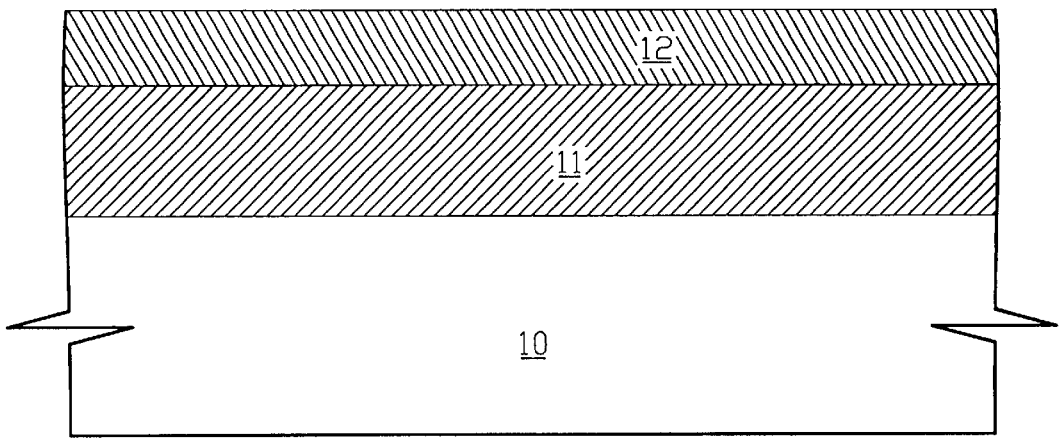
FIG. 1A through FIG. 1D are cross-sectional illustrations for showing effect of agglomeration phenomenon and non-uniform distribution of silicide films.
Figure 1B:
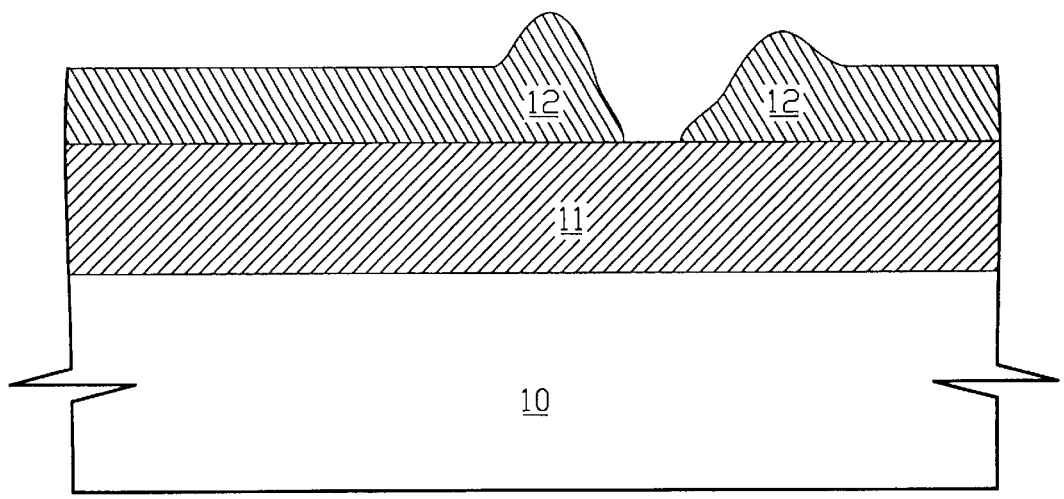
Figure 1C:
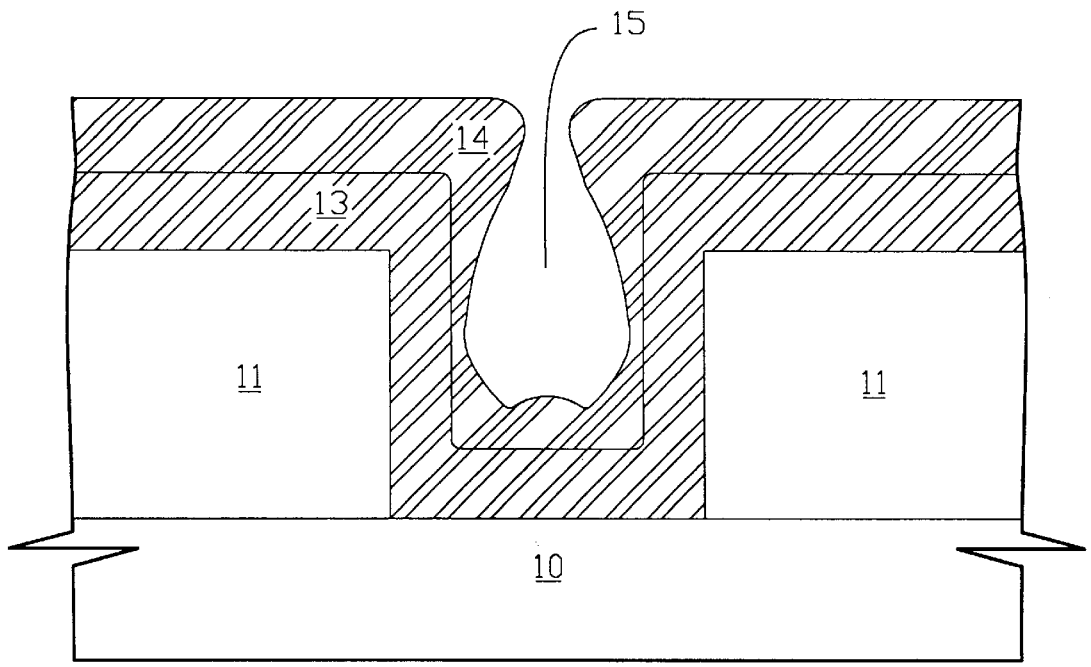
Figure 1D:
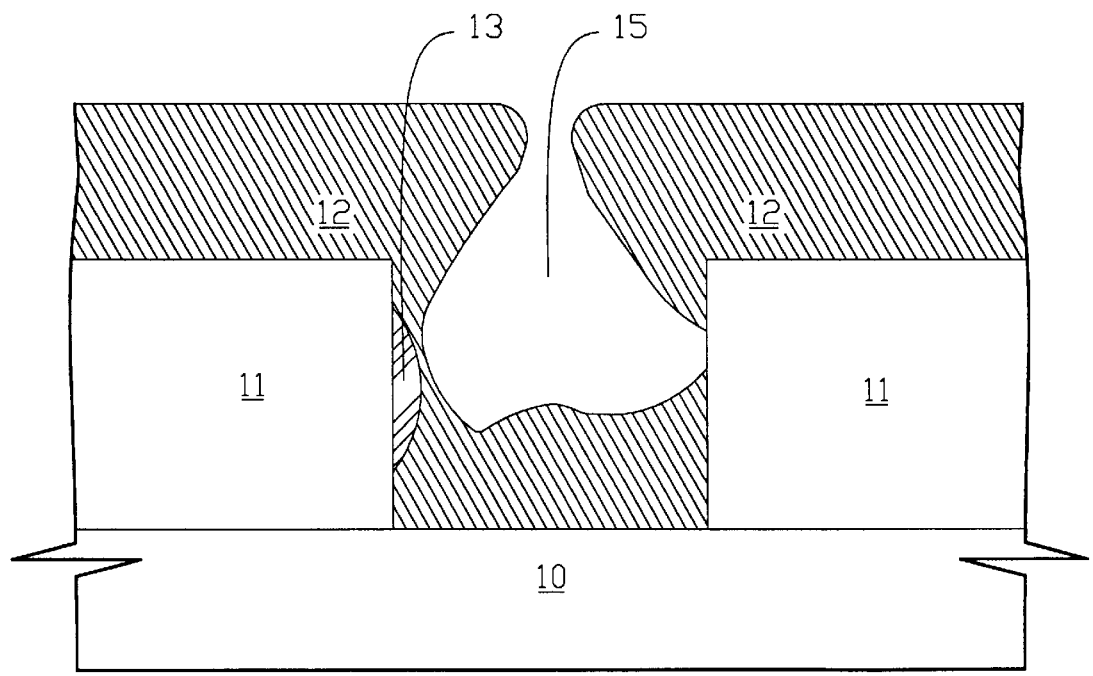
Figure 2A:
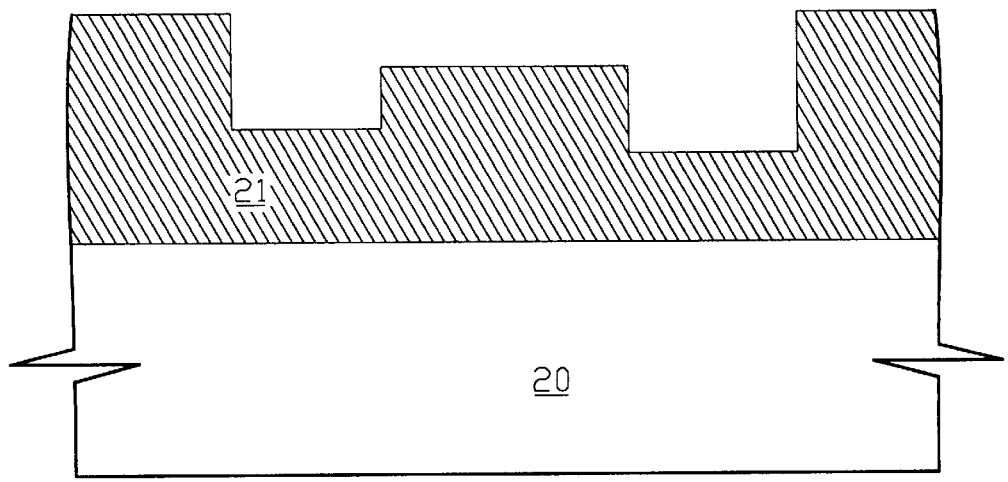
FIG. 2A through FIG. 2E are cross-sectional illustrations about some essential steps of one preferred embodiment of this present invention.

One preferred embodiment of this present invention is a method for forming silicide, at least includes following essential steps:

As FIG. 2A shows, provide substrate 20. Substrate 20 is covered by semiconductor structure 21 which has a rugged topography. Semiconductor structure could be numerous gates and numerous dielectric layers where these gates and these dielectric layers are alternate to each other. Moreover, in order to simplify figures and emphasize effect of this invention, shown topography of semiconductor structure 21 are combination of a series of steps, but this invention is not limited details of rugged topography.

Figure 2B:
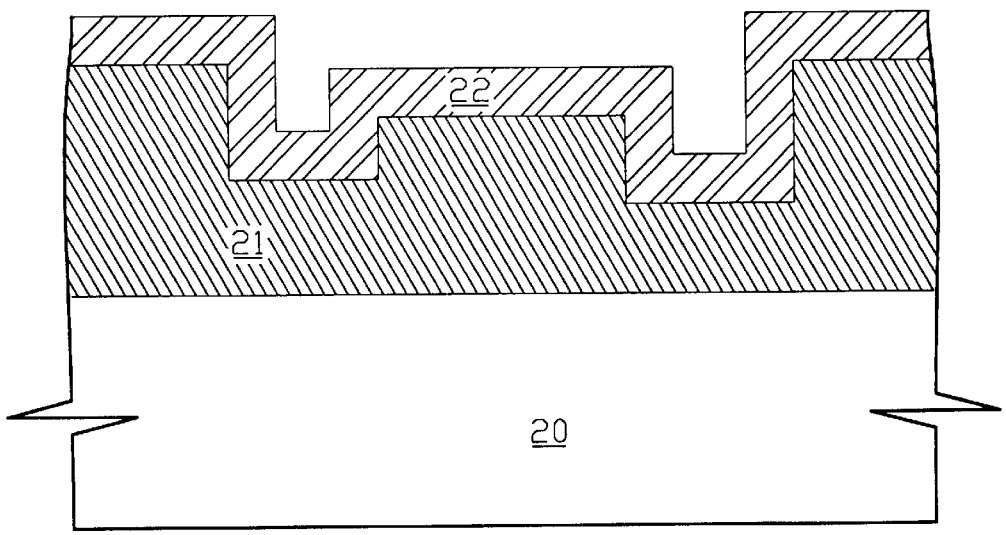

As FIG. 2B shows, form silicon layer 22 on semiconductor structure 21, where topography of silicon layer 22 is similar to the underlying rugged topography of semiconductor structure 21. Moreover, silicon layer 22 usually is conformally formed on semiconductor structure 21, and silicon layer 22 usually is chosen from the group consisting of polysilicon layer, amorphous silicon layer, and expitaxy silicon layer.

Figure 2C:
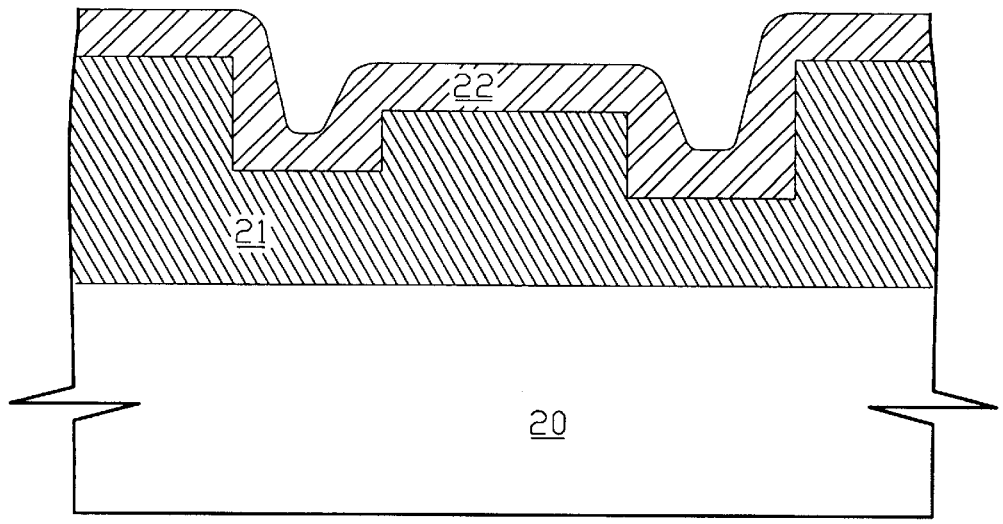

As FIG. 2C shows, etch silicon layer 22 such that topography of silicon layer 22 is smoothed. For example, all sharp corners of silicon layer 22 on sharp corners of semiconductor structure 21 are etched and modified as smoother corners. For example, topography of part of silicon layer 22 which is located on numerous sidewalls of semiconductor structure 21 is transformed into numerous spacers after silicon layer 22 has been etched. Further, silicon layer 22 could be etched by wet etch process or dry etch process, only depends on practical requirement.

Figure 2D:
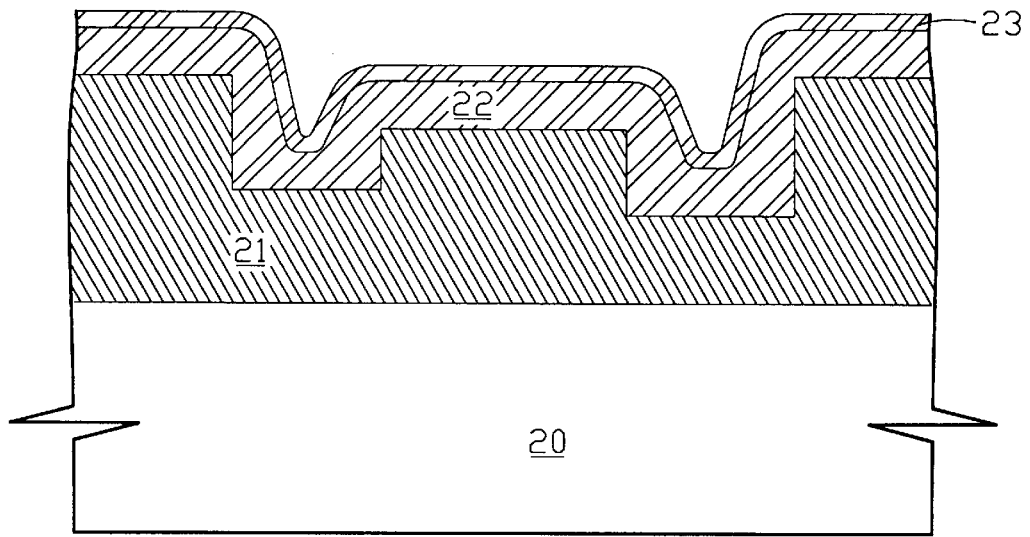

As FIG. 2D shows, form metal layer 23 on silicon layer 22. At this time, the smoother underlying topography could let metal layer 23 is more conformally formed on silicon layer 22. Available material of metal layer 23 is chosen from the group of titanium, cobalt, tungsten, nickel, manganese, platinum, tantalum, and palladium.

Figure 2E:
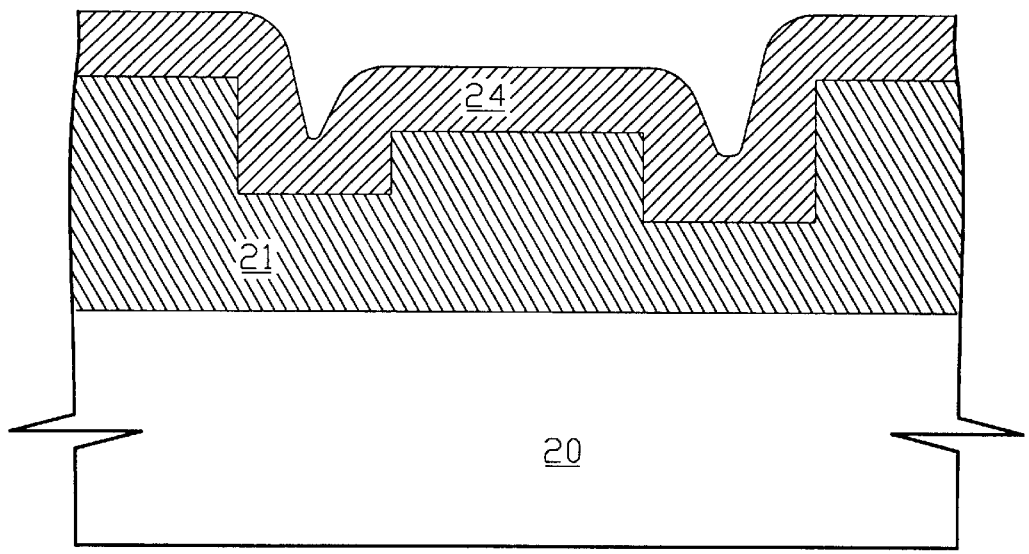

As FIG. 2E shows, perform a thermal process such that silicide layer 24 is formed by reacting of metal layer 23 and silicon layer 22. Whereby, in order to simplify figure, assume both metal layer 23 and silicon layer 22 are totally consumed. Certainly, in most of practical cases, only metal layer 23 is totally consumed but part of silicon layer 22 is remained. Whereby, available material of silicide layer 24 is chosen from the group of $TiSi_2$, $CoSi_2$, $WSi_2$, $NiSi_2$, $MoSi_2$, $PtSi_2$, $TaSi_2$, and $PdSi_2$.

Silicide layer 24 could be used to form numerous suicide lines, such as silicide word line. Silicide lines could be formed by performing a pattern process after silicide layer 24 is formed such that required silicide lines are made of silicide layer 24. However, silicide lines also could be formed without pattern process but with concept of self-alignment, silicide line could be formed by removing part of silicon layer 22 before metal layer 23 is formed, where removed part of silicon layer 22 is located on the predetermined locations of numerous silicon lines. Thus, silicide lines are formed just after thermal process is finished, and residual metal layer 23 is removed.

Figure 3A:
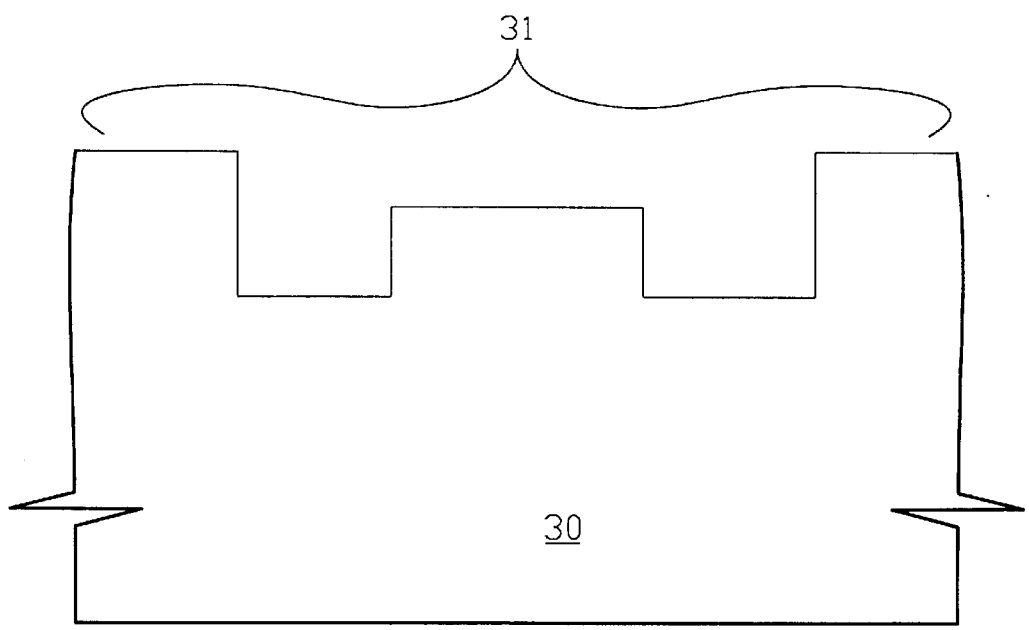
FIG. 3A through FIG. 3E are cross-sectional illustrations about some essential steps of another preferred embodiment of this present invention.

Another preferred embodiment of this invention is a method for forming suicide, at least includes following essential steps:

As FIG. 3A shows, provide substrate 30 which has rugged first surface 31.

Figure 3B:
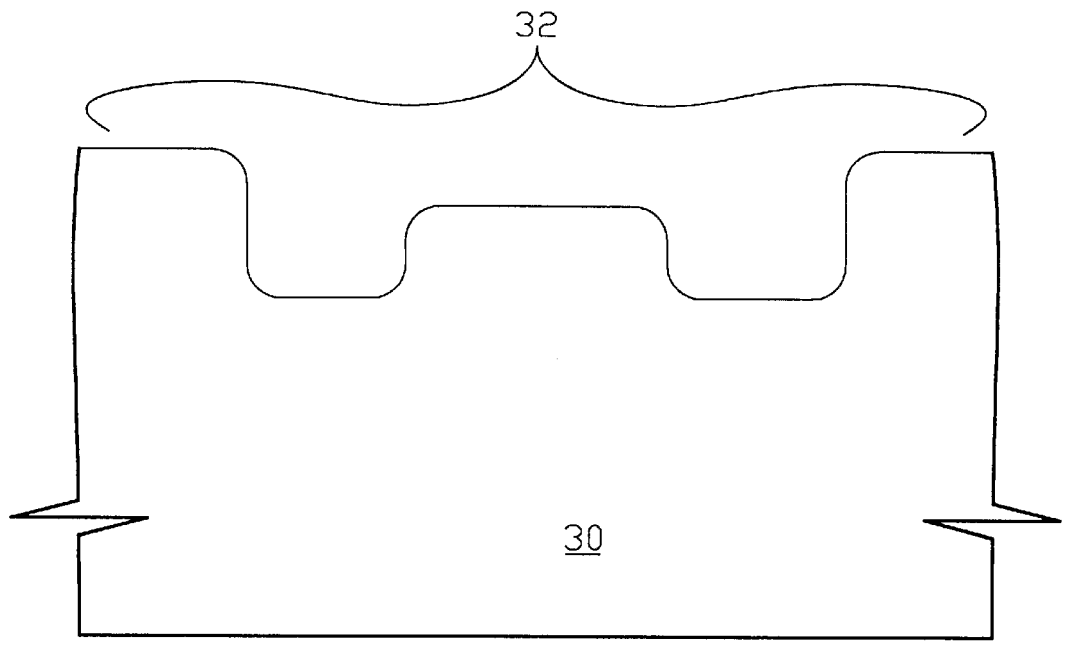

As FIG. 3B shows, etch substrate 30 such that first surface 31 is changed into second surface 32. Where, the topography of second surface 32 is smoother than the topography of first surface 31. Further, substrate 30 could be etched by wet etch process or dry etch process, only depends on practical requirement.

Figure 3C:
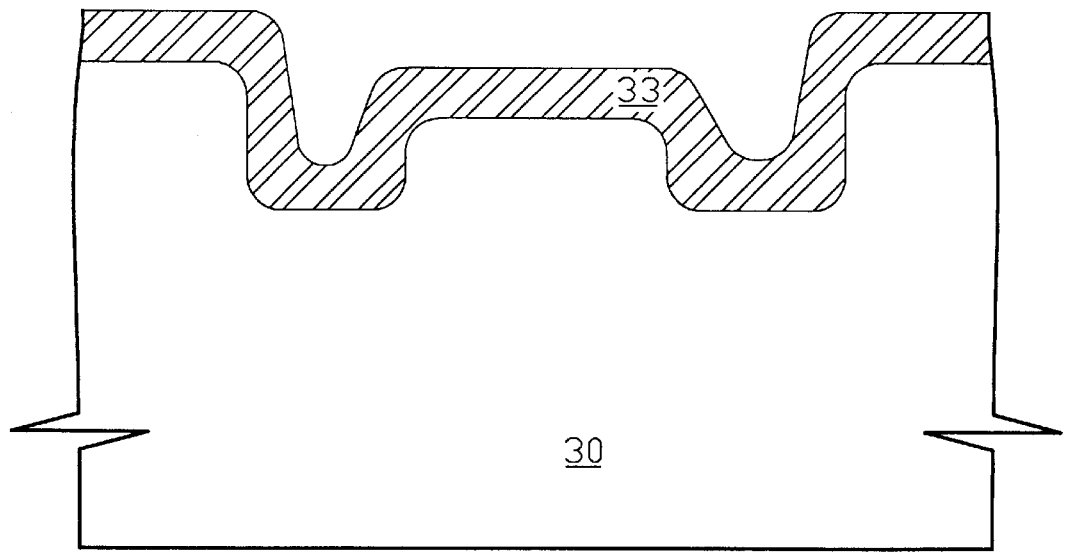

As FIG. 3C shows, form silicon layer 33 on second surface 32, where the topography of silicon layer 33 is similar to the topography of second surface 32. Silicon layer 33 usually is chosen from the group consisting of polysilicon layer, amorphous silicon layer, and expitaxy silicon layer. Moreover, an optional step is to etch silicon layer 33 such that the topography of silicon layer 33 is smoother than the topography of second surface 32.

Figure 3D:
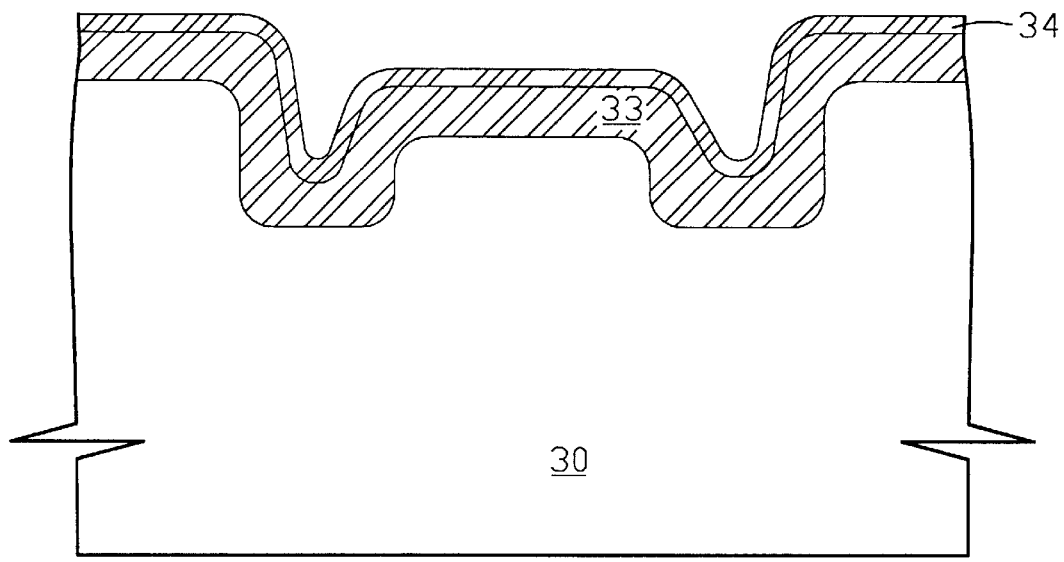

As FIG. 3D shows, form metal layer 34 on silicon layer 33. Available material of metal layer 34 usually is chosen from the group of titanium, cobalt, tungsten, nickel, manganese, platinum, tantalum, and palladium.

Figure 3E:
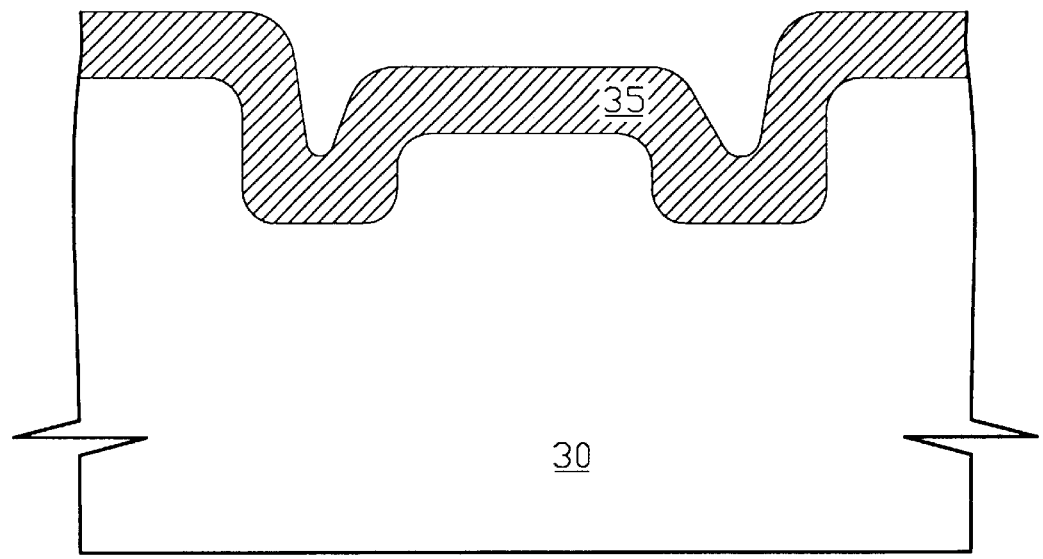

As FIG. 3E shows, perform a thermal process such that silicide layer 35 is formed by reacting of metal layer 34 and silicon layer 33. Where silicide layer 35 could be used to form numerous silicide lines.

Silicide lines could be formed by performing a pattern process to let silicide layer 35 is changed into numerous silicide lines. Silicide lines also could be formed by removing part of silicon layer 33 before metal layer 34 is formed, where removed part of silicon layer 33 is not located on the predetermined locations of numerous silicon lines.

Obviously, thus invention only uses well-known etch process to decrease non-uniformity of both stress and thickness of silicide, and all parameters of silicide fabrication, such as thermal history and material, are not changed. In other words, this present invention is compatible to the typical process of integrated circuit.

From the foregoing, it will be appreciated that, although specific embodiments of the invention have been described herein for the purpose of illustration, various modifications may be made without deviating from the spirit and scope of the invention. Accordingly, the invention is not limited except as by the appended claims.

What is claimed is:

1. A method for forming silicide, comprising:
    providing a substrate, said substrate being covered by a semiconductor structure which comprises a rugged topography;
    forming a silicon layer on said semiconductor structure, a topography of said silicon layer being similar to said rugged topography;
    etching said silicon layer, such that the topography of said silicon layer is smoothed, wherein each corner on the top surface of said silicon layer is more curved after said silicon layer is etched;
    forming a metal layer on said silicon layer; and
    performing a thermal process, such that a silicide layer is formed by reacting of said metal layer and said silicon layer.

2. The method of claim 1, further comprises a step of performing a pattern process such that a plurality of silicide lines are made from said silicide layer.

3. The method of claim 1, further comprising a step of removing part of said silicon layer before said metal layer is formed, said part of said silicon layer being located on the predetermined locations of a plurality of suicide lines.

4. The method of claim 1, said semiconductor structure comprises a plurality of gates and a plurality of dielectric layers, said gates and said dielectric layers are alternate to each other.

5. The method of claim 1, said semiconductor structure comprises a plurality of bit line dielectric layers.

6. The method of claim 1, said silicon layer is chosen from the group consisting of polysilicon layer, amorphous silicon layer, and expitaxy silicon layer.

7. The method of claim 1, said silicon layer is etched by an etch process which is chosen from the group consisting of wet etch process and dry etch process.

8. The method of claim 1, topography of part of said silicon layer which is located on a plurality of sidewalls of said semiconductor structure is transformed into a plurality of spacers after said silicon layer has been etched.

9. The method of claim 1, wherein material of said metal layer is chosen from the group of: titanium, cobalt, tungsten, nickel, manganese, platinum, tantalum, and palladium.

10. The method of claim 1, wherein material of said silicide layer is chosen from the group of $TiSi_2$, $CoSi_2$, $WSi_2$, $NiSi_2$, $MoSi_2$, $PtSi_2$, $TaSi_2$, and $PdSi_2$.

11. A method for forming silicide, comprising:
    providing a substrate, said substrate having a rugged first surface;
    etching said substrate, such that said first surface is changed into a second surface, the topography of said second surface being smoother than the topography of said first surface;
    forming a silicon layer on said second surface, the topography of said silicon layer being similar to the topography of said second surface;
    forming a metal layer on said silicon layer; and
    performing a thermal process, such that a silicide layer is formed by reacting of said metal layer and said silicon layer.

12. The method of claim 11, further comprises a step of performing a pattern process such that a plurality of silicide lines are made from said silicide layer.

13. The method of claim 11, further comprising a step of removing part of said silicon layer before said metal layer is formed, said part of said silicon layer being not located on the predetermined locations of a plurality of silicide lines.

14. The method of claim 11, further comprises a step of etching said silicon layer before said metal layer is formed, such that the topography of said silicon layer is smoother than the topography of said second surface.

15. The method of claim 11, said silicon layer is chosen from the group consisting of polysilicon layer, amorphous silicon layer, and expitaxy silicon layer.

16. The method of claim 11, said silicon layer is etched by an etch process which is chosen from the group consisting of wet etch process and dry etch process.

17. The method of claim 11, topography of part of said silicon layer which is located on a plurality of sidewalls of said semiconductor structure is transformed into a plurality of spacers after said silicon layer has been etched.

18. The method of claim 11, wherein material of said metal layer is chosen from the group of titanium, cobalt, tungsten, nickel, manganese, platinum, tantalum, and palladium.

19. A method for forming silicide line, comprising:
    providing a substrate, said substrate comprising a plurality of holes;
    forming a silicon layer on said semiconductor structure, topography of said silicon layer being similar to the topography of said substrate;
    etching said silicon layer, such that part of said silicon layer which is located on the sidewalls of said holes being changed into a plurality of spacers;
    forming a metal layer on said silicon layer;
    performing a thermal process, such that a silicide layer is made from both said metal layer and said silicon layer; and
    performing a pattern process, such that a plurality of silicide lines are made from said silicide layer.

* * * * *